United States Patent
Drobnitzky

(12) 
(10) Patent No.: US 6,469,510 B2
(45) Date of Patent: Oct. 22, 2002

(54) MAGNETIC RESONANCE APPARATUS HAVING A SOUNDPROOFING STRUCTURE

(75) Inventor: Matthias Drobnitzky, Spardorf (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 10/044,409

(22) Filed: Jan. 11, 2002

(65) Prior Publication Data

US 2002/0105330 A1 Aug. 8, 2002

(30) Foreign Application Priority Data

Jan. 11, 2001 (DE) ......................................... 101 01 072

(51) Int. Cl.[7] ................................................. G01V 3/00
(52) U.S. Cl. ........................................ 324/318; 324/319
(58) Field of Search ................................ 324/318, 319, 324/320, 322, 300, 306, 307, 309, 314; 600/410, 421, 422

(56) References Cited

U.S. PATENT DOCUMENTS

| | | | |
|---|---|---|---|
| 4,954,781 A | | 9/1990 | Hirata ........................ 324/318 |
| 5,235,283 A | * | 8/1993 | Lehne et al. ................ 324/318 |
| 6,018,210 A | * | 1/2000 | Date et al. .................. 310/311 |
| 6,073,363 A | | 6/2000 | Lee ................................ 34/85 |
| 6,075,363 A | * | 6/2000 | Sellers et al. ............... 324/318 |
| 6,107,799 A | | 8/2000 | Sellers et al. ............... 324/318 |

FOREIGN PATENT DOCUMENTS

| | | |
|---|---|---|
| DE | 24 33 795 | 7/1974 |
| DE | 198 38 390 | 8/1998 |

OTHER PUBLICATIONS

"Locally Resonant Sonic Materials," Liu et al., Science, vol. 289, Sep. 8, 2000, pp. 1734–1736.

* cited by examiner

Primary Examiner—Louis Arana
(74) Attorney, Agent, or Firm—Schiff Hardin & Waite

(57) ABSTRACT

A magnetic resonance apparatus comprises a soundproofing structure that contains a material having an effectively negative elasticity constant.

11 Claims, 2 Drawing Sheets

MAGNETIC RESONANCE APPARATUS HAVING A SOUNDPROOFING STRUCTURE

BACKGROUND OF THE INVENTION

1. Field of the Invention

The present invention is directed to a magnetic resonance apparatus.

2. Description of the Prior Art

Magnetic resonance technology is a known technique for producing images of the inside of the body of an examination subject. To that end, rapidly switched gradient fields that are generated by a gradient coil system are superimposed on a static basic magnetic field that is generated by a basic field magnet system in a magnetic resonance apparatus. The magnetic resonance apparatus further has a radio-frequency system that emits radio-frequency signals into the examination subject for triggering magnetic resonance signals, and for picking up the magnetic resonance signals that are generated. Magnetic resonance images are produced on the basis of the received signals.

For generating gradient fields, suitable currents are set in the gradient coils of the gradient coil system. The amplitudes of the required currents thereby amount to up to several 100 A. The current rise and decay rates amount up to several 100 kA/s. Given an existing basic magnetic field on the order of magnitude of 1 T, Lorentz forces act on these temporally varying currents in the gradient coils, these Lorentz forces leading to mechanical vibrations of the gradient coil system. These vibrations are forwarded to the surface of the device via various propagation paths. At the surface, these mechanical vibrations are converted into acoustic vibrations that ultimately lead to inherently unwanted noise.

These vibrations can be analyzed, for example, on the basis of the natural vibrational behavior of the gradient coil system. The natural behavior is determined by the Eigen-frequencies and the natural vibrational modes. The effect of the Lorentz forces on the modes is described in the form of participation factors. These indicate how strongly the Lorentz forces excite a specific mode. Given knowledge of the participation factors and of the Eigen-frequencies, the vibration of the gradient coil system can be defined for every location and for every frequency by a superimposing the vibrations of the individual self-oscillation modes. In particular, a resonant excitation of one of the aforementioned modes due to a pulse sequence of the magnetic resonance apparatus leads to an extremely great amount of noise.

The article by Z. Liu et al, "Locally Resonant Sonic Materials", Science, Vol. 289, Sep. 8, 2000, pages 1734 through 1736, describes a material with which sound waves that exhibit a wavelength, or a wavelength range around a wavelength can be highly efficiently reduced in amplitude given layer thicknesses of the material that are one through two orders of magnitude smaller than the wavelength. Due to resonant effects, the material thereby an effectively negative elasticity constant, at least for the wavelength range. The material thus can be tuned to a prescribable wavelength or frequency range that is to be reduced. It is described as an example in this article that an amplitude attenuation of the oscillation by more than three powers of ten can be achieved for a 400 Hz oscillation—which corresponds to a wavelength of approximately 83 cm in air—with an approximately 2 cm thick layer of the material.

A great number of passive and active noise-reduction measures are known for magnetic resonance apparatuses. Included, for example, among known, passive noise reduction measures are the application of sound-damping foam materials to cladding parts facing toward the gradient coil system and/or the use of flexible layers at and/or in the gradient coil system. Such measures are disclosed, for example, U.S. Pat. No. 4,954,781.

SUMMARY OF THE INVENTION

An object of the present invention is to provide an improved magnetic resonance apparatus that, in particular, exhibits low noise emission values.

This object is inventively achieved in a magnetic resonance apparatus having a sound-proofing structure that contains a material having an effectively negative elasticity constant.

Due to the employment of a soundproofing structure containing a material having an effectively negative elasticity constant, noise emission by the magnetic resonance apparatus can be highly effectively reduced at least for a prescribable frequency range with layer thicknesses of the soundproofing structure that are one through two orders of magnitude smaller than the appertaining wavelengths of the prescribable frequency range. As a result, a high noise-reducing effect can be achieved with a soundproofing structure having a small additional volume and a small additional mass. Further details about the material are described, for example, in the initially cited article by Z. Liu et al.

DESCRIPTION OF THE PREFERRED EMBODIMENTS

Figure 1:
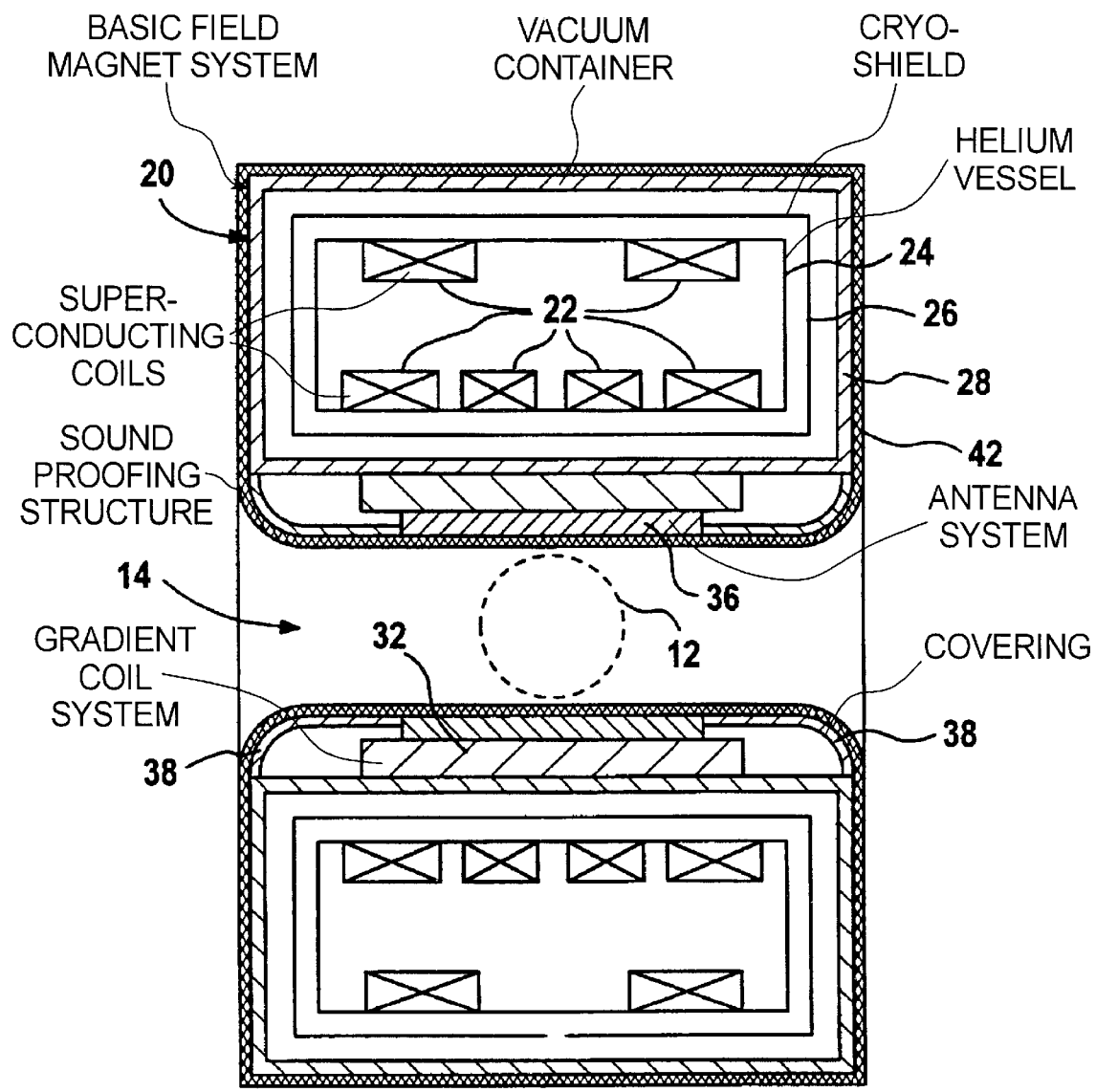
FIG. 1 is a longitudinal section through a magnetic resonance apparatus having a soundproofing structure in accordance with the invention.

As an exemplary embodiment of the invention, FIG. 1 shows a longitudinal section through a magnetic resonance apparatus having a soundproofing structure 42.

For generating a uniform basic magnetic field at least within an imaging volume 12 of the apparatus, the apparatus has a superconducting basic field magnet system 20. This contains a hollow-cylindrical helium vessel 24 in which superconducting coils 22 are arranged, the coils 22 being cooled by the liquid helium surrounding them. The helium vessel 24 is thereby at least partially surrounded by a cryo-shield 26, the effect thereof being that optimally little thermal radiation penetrates to the helium vessel 24. The cryo-shield 26 is surrounded by a hollow-cylindrical vacuum container 28.

A gradient coil system 32 and an antenna system 36 are arranged in a cylindrical opening of the vacuum container 28. The gradient coil system 32 is fashioned for generating temporally varying gradient fields at least within the imaging volume 12. Radio-frequency signals for triggering magnetic resonance signals are emitted into an imaged region of an examination subject seated in the imaging volume 12 with the antenna system 36, and the magnetic resonance signals that are generated can be picked up with the antenna system 36, magnetic resonance images are produced on the basis of these magnetic resonance signals. A funnel-shaped covering 38 is attached to the antenna system 36.

In a conventional magnetic resonance apparatus without a soundproofing structure 42, the funnel-shaped covering 38 together with the antenna system 36 in the region of an examination space 14 and of the vacuum container 28 form a sound-emitting surface of the apparatus toward the environment in the remaining region of the apparatus. This sound-emitting surface is completely clad by the soundproofing structure 42 in the magnetic resonance apparatus of FIG. 1. The structure 42 contains a material having an effectively negative elasticity constant. The soundproofing structure 42 is fashioned as a thin layer having, for example, a thickness of approximately 1 cm. The material of the soundproofing structure 42 is fashioned such that the soundproofing structure 42 acts at least on a frequency range having high amplitude values of a sound spectrum that can be excited given operation of the magnetic resonance apparatus. As experience has shown, a banana-shaped natural vibrational mode of the gradient coil system 32 is dominant, i.e., nearly every pulse sequence implementable in the apparatus excites this mode to a comparatively strong degree. This produces a significant sound spike without counter-measures. Since the aforementioned mode has an Eigen-frequency of approximately 700 Hz, the material of the structure 42 is designed for a frequency range around 700 Hz. The aforementioned noise spike is particularly effectively reduced therewith.

As a result of the cladding, the soundproofing structure 42 develops its inhibiting effect on noise propagation not only on the gradient coil system as a noise generator, but also on further noise generators, for example, a cryo-head of the superconducting basic field magnet system 20. In another embodiment, a soundproofing structure is arranged at the end inside of cladding on parts of the magnetic resonance apparatus.

Figure 2:
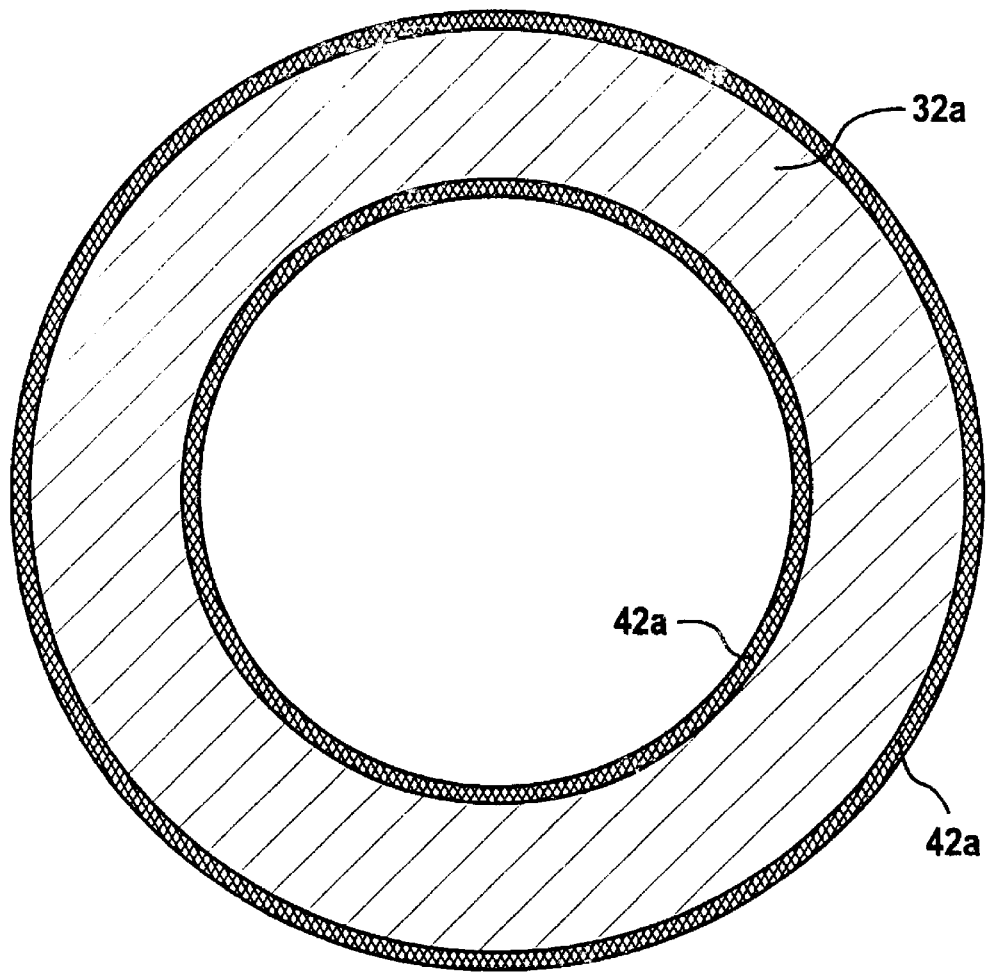
FIG. 2 is a cross-section through a gradient coil system having a soundproofing structure in accordance with the invention.

As a further exemplary embodiment of the invention, FIG. 2 shows a cross-section through an approximately hollow-cylindrical gradient coil system 32a that is completely clad with a soundproofing structure 42a. The gradient coil system 32a completely clad by the soundproofing structure 42a represents an alternative or augmented embodiment of that described for FIG. 1. Implementation, design and functioning of the soundproofing structure 42a correspond to that described for the soundproofing structure 42 in FIG. 1.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
    a magnetic resonance scanner having a plurality of apparatus components; and
    a soundproofing structure disposed at said magnetic resonance scanner containing a material having an effectively negative elasticity constant.

2. A magnetic resonance apparatus as claimed in claim 1 wherein said soundproofing structure is disposed surface-proximate to an apparatus component among said plurality of apparatus components.

3. A magnetic resonance apparatus as claimed in claim 1 wherein said apparatus component to which said soundproofing structure is disposed surface-proximate is a gradient coil system.

4. A magnetic resonance apparatus as claimed in claim 1 wherein said soundproofing structure forms a surface of an apparatus component among said plurality of apparatus components.

5. A magnetic resonance apparatus as claimed in claim 4 wherein said apparatus component of which said soundproofing structure forms said surface is a gradient coil system.

6. A magnetic resonance apparatus as claimed in claim 1 wherein said soundproofing structure completely envelops an apparatus component among said plurality of apparatus components.

7. A magnetic resonance apparatus as claimed in claim 6 wherein said apparatus component which is completely enveloped by said soundproofing structures is a basic field magnet system.

8. A magnetic resonance apparatus as claimed in claim 1 wherein said soundproofing structure comprises a thin layer.

9. A magnetic resonance apparatus as claimed in claim 8 wherein said layer has a thickness in a range from approximately 0.5 cm through 5 cm.

10. A magnetic resonance apparatus as claimed in claim 1 wherein said material of said soundproofing structure is effective in a frequency range with high amplitude values of a sound spectrum produced during operation of said magnetic resonance scanner.

11. A magnetic resonance apparatus as claimed in claim 10 wherein said magnetic resonance scanner comprises a gradient coil system, as one of said apparatus components, said gradient coil system having a natural oscillation mode, with a mode frequency associated therewith, which is excited during operation of said magnetic resonance scanner, and wherein said frequency range of said material encompasses said mode frequency.

* * * * *